United States Patent [19]

Izzard

[11] Patent Number: 5,774,510
[45] Date of Patent: Jun. 30, 1998

[54] FIRST-ORDER LOOP CONTROL CONFIGURATION FOR A PHASE-ROTATOR BASED CLOCK SYNCHRONIZATION CIRCUIT

[75] Inventor: Martin J. Izzard, Dallas, Tex.

[73] Assignee: Texas Instruments Incorporated, Dallas, Tex.

[21] Appl. No.: 609,304

[22] Filed: Mar. 1, 1996

Related U.S. Application Data

[63] Continuation of Ser. No. 255,213, Jun. 7, 1994, Pat. No. 5,526,380.
[51] Int. Cl.[6] .................................................. H03D 3/02
[52] U.S. Cl. .......................................... 375/375; 375/373
[58] Field of Search .................................. 375/322, 329, 375/332, 340, 344, 371, 373, 375–376; 329/304–305, 307–310; 327/163, 236, 238

[56] References Cited

U.S. PATENT DOCUMENTS

| 4,599,732 | 7/1986 | LeFever | 375/231 |
| 4,816,775 | 3/1989 | Ryan | 331/12 |
| 5,311,545 | 5/1994 | Critchlow | 375/332 |

OTHER PUBLICATIONS

IEEE International Solid–State Circuits Conference, 1994 (pp. 300,301,237,236,329, and 330) Session 18/High–Performance Logic and Circuit Techniques/Paper FA 18.6, A 2.5V Delay–Locked Loop for an 18 Mb 500MB/s DRAM.

IEEE 1992 "Continuously Variable Gigahertz Phase–Shifter IC Covering More Than One Frequency Decade" by Lothar Schmidt and Hans–Martin Rein.

*Primary Examiner*—Young T. Tse
*Attorney, Agent, or Firm*—Mark A. Valetti; Wade James Brady, III; Richard L. Donaldson

[57] ABSTRACT

An embodiment of the present invention is electronic circuitry for producing an I-phase quadrant pointer (FI) and a Q-phase quadrant pointer (FQ) by sampling a feed clock (IC) and a quadrature feed clock (QC), the circuitry comprises: a first quadrant detector (406, FIG. 5) for producing the Q-phase quadrant pointer in response to receipt of the feed clock and input data; a second quadrant detector (408, FIG. 5) for producing the I-phase quadrant pointer in response to receipt of the feed clock and the input data; and wherein the I-phase quadrant pointer and the Q-phase quadrant pointer can be utilized to determine the phase quadrant of the input data.

18 Claims, 9 Drawing Sheets

DIGITALLY LINEARIZED TYPE, X,Y

GILBERT CELL TYPE, X,Y

FIRST-ORDER LOOP CONTROL CONFIGURATION FOR A PHASE-ROTATOR BASED CLOCK SYNCHRONIZATION CIRCUIT

This is a continuation of application Ser. No. 08/255,213 filed Jun. 7, 1994, now U.S. Pat. No. 5,526,380.

FIELD OF THE INVENTION

The instant invention relates to electronic circuitry and, more specifically, to analog clock synchronization circuitry.

BACKGROUND OF THE INVENTION

In digital electronics data can either be synchronous or asynchronous. Synchronous data is basically clocked by a clock with a specific period. However, asynchronous data is not transmitted or received at a regular period. Therefore, the duration between receipt of different quantums of asynchronous data is varying.

One method of receiving data is to receive a clock signal and to clock the incoming data at every clock signal. This type of receipt of data is a synchronous type receipt. A somewhat different method must be used to receive asynchronous data. Referring to FIG. 1, in one method of data recovery, data is received by clock recovery circuitry 104. Clock recovery circuitry 104 provides a clock signal to retimer 102 so as to allow retimer 102, which is preferably a flip-flop or a DMUX, to receive the data. Therefore, clock recovery circuitry 104 recovers a clocking signal from the retrieved data and uses this to actually clock the received data.

Referring to FIG. 1a, typically, clock recovery circuitry 104 is implemented by use of a phase-lock-loop (PLL). This typically consists of phase detector 106, filter 108 and oscillator 110. While this type of configuration is typically used, there are problems associated with such a configuration. First, good oscillators are be hard to fabricate, and, therefore, expensive. Second, an oscillator of lesser quality will not be able provide a periodic signal that is sufficient to meet that tight timing constraints of present and future high-speed electronics. Third, even high-quality oscillators may not work properly where the ambient conditions are less than ideal. Therefore, a means for receiving data without the use of an oscillator is critical.

It is an object of the present invention to provide circuitry which can be utilized to recover data without the use of an oscillator.

SUMMARY OF THE INVENTION

The clock synchronizer of the present invention is a data retiming scheme using no oscillator. A reference clock is phase shifted to match the data phase. A clock rotator is used to shift the clock phase. Preferably, the clock synchronizer of the present invention is a first order loop with a mainly analog loop control. An analog method of controlling the phase-rotator requires less power than a digital method with comparable performance. A novel loop control concept is the subject of the instant invention. The use of a clock synchronizer instead of a phase-locked loop for data retiming avoids the use of an oscillator which is a difficult circuit element to guarantee operationally.

On embodiment of the present invention is electronic circuitry for recovering data, the circuitry comprises: a retimer circuit for accepting data in response to the receipt of a recovered clock signal; and a clock recovery circuit for receiving a reference clock signal and the data and producing the recovered clock signal. The clock recovery circuit comprises: a phase detector for receiving the data and the recovered clock signal and for producing an output based on the phase of the data and the recovered clock; a phase rotator for accepting the output of the phase detector and for altering the phase of the recovered clock based on the output of the phase detector; and wherein the phase detector and the phase rotator form a closed loop.

Another embodiment of the present invention is electronic circuitry for producing an I-phase quadrant pointer and a Q-phase quadrant pointer by sampling a feed clock and a quadrature feed clock, the circuitry comprises: a first quadrant detector (preferably a phase sampler) for producing the Q-phase quadrant pointer in response to receipt of the feed clock and input data; a second quadrant detector (preferably a phase sampler) for producing the I-phase quadrant pointer in response to receipt of the feed clock and the input data; and wherein the I-phase quadrant pointer and the Q-phase quadrant pointer can be utilized to determine the phase quadrant of the input data.

Another embodiment of the present invention is electronic circuitry for producing a clock and changing the phase of the clock within one quadrant in response to a feed clock, a quadrature feed clock and input data, the circuitry comprises: circuitry for providing an I-phase quadrant pointer; circuitry for providing a Q-phase quadrant pointer; a first logic gate (preferably an XOR gate) for accepting the I-phase quadrant pointer and the Q-phase quadrant pointer and for producing a sign modifier signal; circuitry for providing a phase command signal in response receipt of the input data and the phase rotated clock; a second logic gate (preferably an XOR gate) for accepting the phase command signal and the sign modifier signal and for producing an up/down signal, the up/down signal specifies the manner in which to change the phase of the clock; and wherein the electronic circuitry is operable to re-map the phase of one quadrant into that of any of the other three quadrants by means of decoding the I-phase quadrant pointer and the Q-phase quadrant pointer.

Another embodiment of the present invention is electronic circuitry for producing a clock signal whose phase matches the phase of input data in response to receipt of the input data and a reference clock signal, the circuitry comprises: circuitry (preferably a quadrature generator) for providing the quadrature of the reference clock signal; circuitry (preferably a quadrant detector) for providing a Q-phase quadrant pointer in response to the input data and the reference clock; circuitry (preferably a phase detector) for providing an I-phase quadrant pointer in response to the input data and the quadrature reference clock; circuitry for providing a phase-change signal for specifying whether to rotate the phase of the produced clock signal in one direction or the other, the circuitry operable in response to the I-phase quadrant pointer, Q-phase quadrant pointer and the produced clock signal; and a phase rotator for changing the phase of the produced clock signal in response to the phase-change signal, the I-phase quadrant pointer, the Q-phase quadrant pointer, the reference clock, and the quadrature reference clock. Preferably the quadrant detectors utilized in this embodiment comprise: a first latch clocked by the input data and operable to receive the reference clock, the first latch operable to latch on the rising edge of the reference clock signal; a second latch clocked by the input data and operable to receive the reference clock, and the second latch operable to latch on the falling edge of the reference clock signal; and a multiplexer clocked by the input data and connected to the output of the first and second latches, the multiplexer operable to selectively produce either the output of the first or second latch as valid phase information. In addition, it is preferable that the circuitry for providing a phase-change signal comprises: a phase detector for producing a phase command signal in response to the produced clock signal and the input data; and circuitry for producing the phase-change signal in response to receipt of the phase command signal, the I-phase quadrant signal and the Q-phase quadrant signal.

Another embodiment of the present invention is electronic circuitry for producing a clock signal, and its quadrature, whose phase matches the phase of input data in response to receipt of the input data and a reference clock signal, the circuitry comprises: circuitry for providing the quadrature of the reference clock signal; circuitry for providing a Q-phase quadrant pointer in response to the input data, and the reference clock; circuitry for providing an I-phase quadrant pointer in response to the input data, and the quadrature reference clock; circuitry for providing a phase signal in response to the produced clock, the quadrature of the produced clock and the input data; circuitry for providing a phase-change signal for specifying whether to rotate the phase of the produced clock signal in one direction or the other, the circuitry operable in response to the I-phase quadrant pointer, Q-phase quadrant pointer and the produced clock signal; and a phase rotator for changing the phase of the produced clock and the quadrature of the produced clock in response to the phase-change signal, the I-phase quadrant pointer, the Q-phase quadrant pointer, the reference clock, and the quadrature reference clock. Preferably the circuitry for providing the Q-phase quadrant pointer and the circuitry for providing the I-phase quadrant pointer are quadrant detectors responsive to the reference clock or its quadrature, the input data and the quadrature of the produced clock. However, the circuitry for providing the Q-phase quadrant pointer and the circuitry for providing the I-phase quadrant pointer can include a phase sampler and an XOR gate instead of a phase detector. Preferably, the circuitry for providing a phase signal is comprised of: a first phase sampler for providing a first sample signal; a second phase sampler for providing a second sample signal; and a logic gate for producing the phase signal in response to receipt of the first and second sample signals.

Another embodiment of the present invention is electronic circuitry for producing a clock signal, and its quadrature, whose phase matches the phase of input data in response to receipt of the input data and a reference clock signal, the circuitry comprises: circuitry for providing the quadrature of the reference clock signal; circuitry for providing a Q-phase quadrant pointer in response to the input data, and the reference clock; circuitry for providing an I-phase quadrant pointer in response to the input data, and the quadrature reference clock; circuitry for providing a phase signal in response to the produced clock, the quadrature of the produced clock and the input data; circuitry for providing a phase-change signal for specifying whether to rotate the phase of the produced clock signal in one direction or the other, the circuitry operable in response to the I-phase quadrant pointer, Q-phase quadrant pointer and the produced clock signal; a first phase rotator for changing the phase of the produced clock in response to the phase-change signal, the I-phase quadrant pointer, the Q-phase quadrant pointer, the reference clock, and the quadrature reference clock; and a second phase rotator for changing the phase of the quadrature of the produced clock in response to the phase-change signal, the I-phase quadrant pointer, the Q-phase quadrant pointer, the reference clock, and the quadrature reference clock. Preferably, the circuitry for providing a Q-phase quadrant pointer includes a third phase rotator so as to delay the output of the Q-phase quadrant pointer substantially the same amount as the delay of the output of the produced clock and the quadrature of the produced clock. In addition, it is preferable that the circuitry for providing a I-phase quadrant pointer includes a fourth phase rotator so as to delay the output of the Q-phase quadrant pointer substantially the same amount as the delay of the output of the produced clock and the quadrature of the produced clock.

DETAILED DESCRIPTION OF PREFERRED EMBODIMENTS

The clock synchronizer of the present invention is a data retiming system using a control loop but no oscillator to achieve clock recovery. A reference clock is phase shifted, by means of a phase-rotator, to match the phase of the input data.

Figure 3:
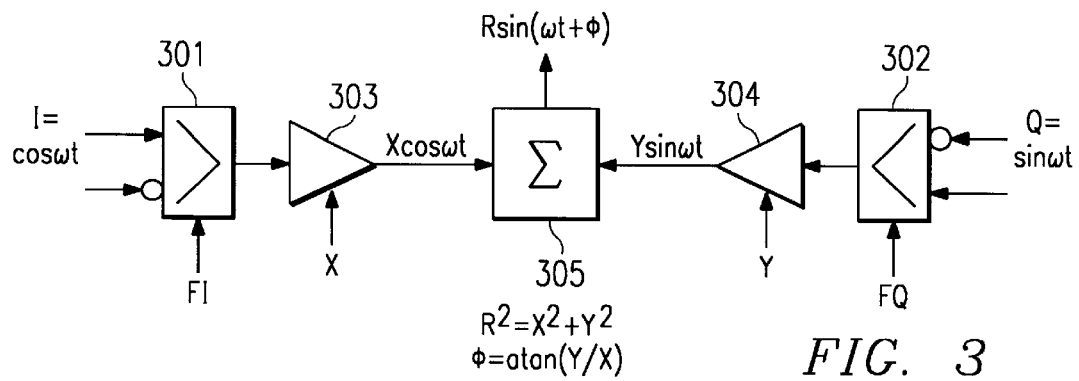
FIG. 3 is a block diagram illustrating the operation of a phase-rotator.

A phase-rotator is a circuit which can create any arbitrary output phase from a quadrature signal pair input, I and Q. Referring to FIG. 3, a simplistic version of a phase-rotator may comprise a pair of multiplexers (301, 302), a pair of amplifiers (303, 304) and a summer (305). The phase selection is in response to a pair of weighting factor signals (which are preferably analog), X and Y, and a pair of quadrant pointer bits (which are preferably digital), FI and FQ. Quadrant pointer bits can be used to change the sign of the quadrature feed clocks as a method of reaching all quadrants. For additional details on phase-rotators, note an article by L. Schmidt and H-M. Rein on pages 854–862 of the June of 1992 issue of JSSC (Volume 27). The article is entitled: "Continuously Variable Gigahertz Phase-Shifter IC Covering More Than One Frequency Decade."

Figure 3A:
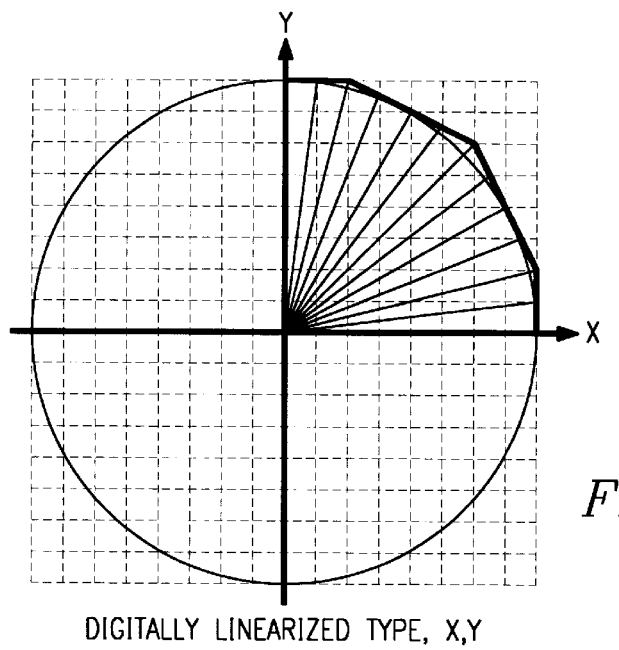
FIGS. 3a and 3b are phasor diagrams illustrating two possible relations for the weighting factors.
Figure 3B:
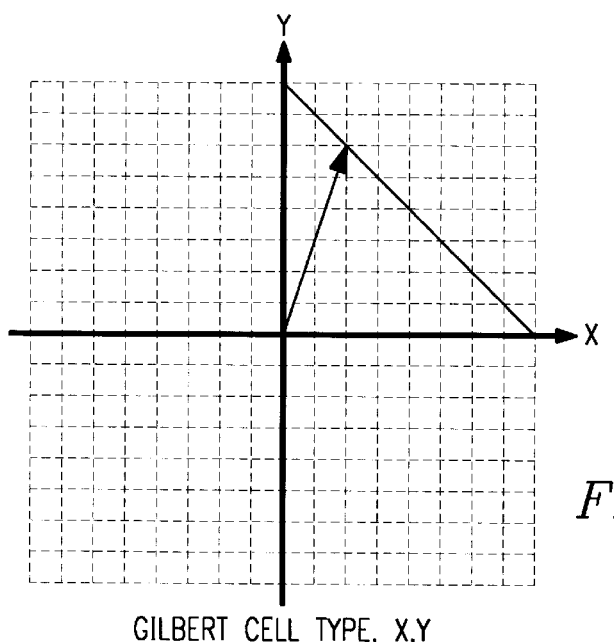

FIGS. 3a and 3b illustrate phasor diagrams for two possible intra-quadrant weighting factor arrangements, one discrete (FIG. 3a), with independent X and Y, and one continuous (FIG. 3b), with complementary X and Y. Weighting factors X and Y can be generated by closed loop control.

Figure 1:
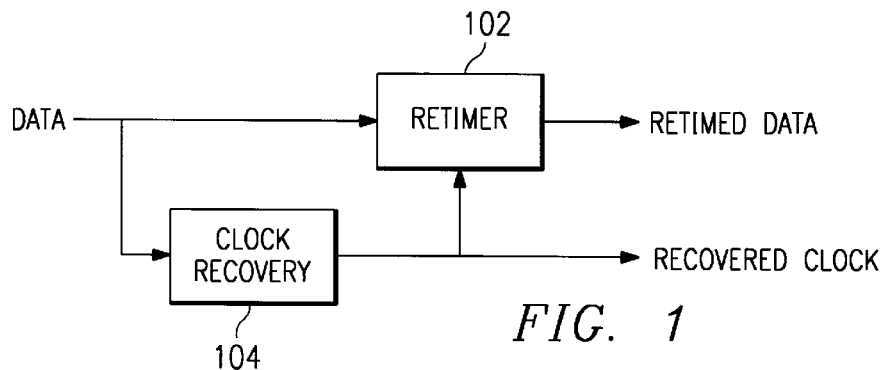
FIG. 1 is a block diagram illustrating a system for recovery data.
Figure 1A:
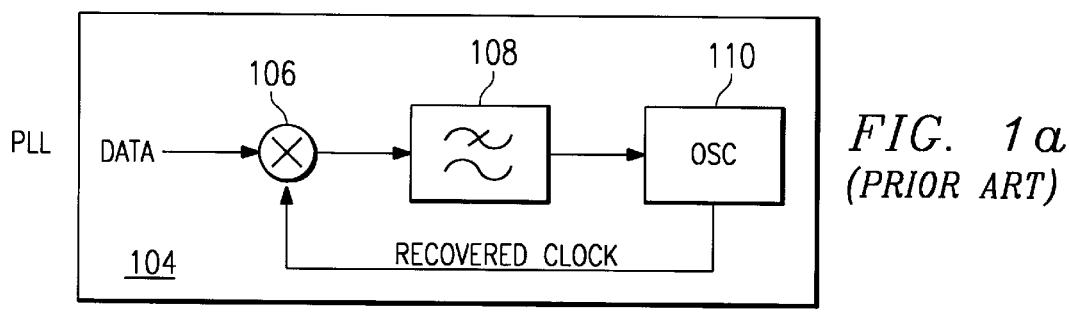
FIG. 1a is a block diagram of phased-locked loop of the prior art.
Figure 2:
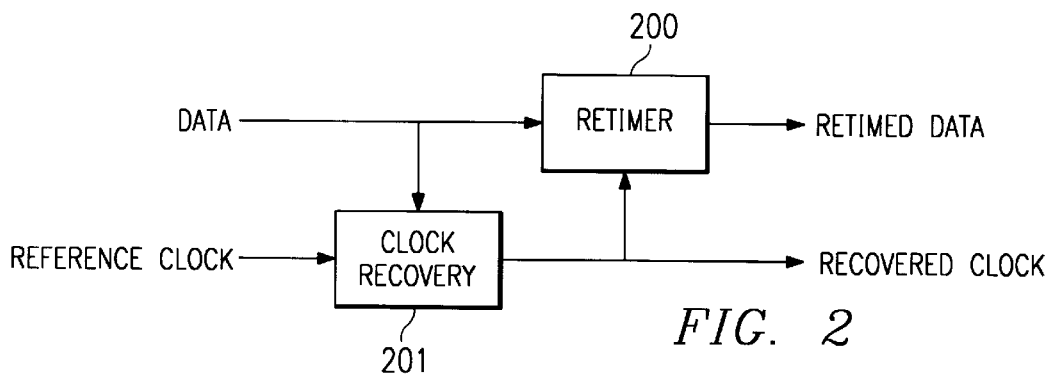
FIGS. 2 and 2a are block diagrams illustrating the data recovery system of the instant invention.
Figure 2A:
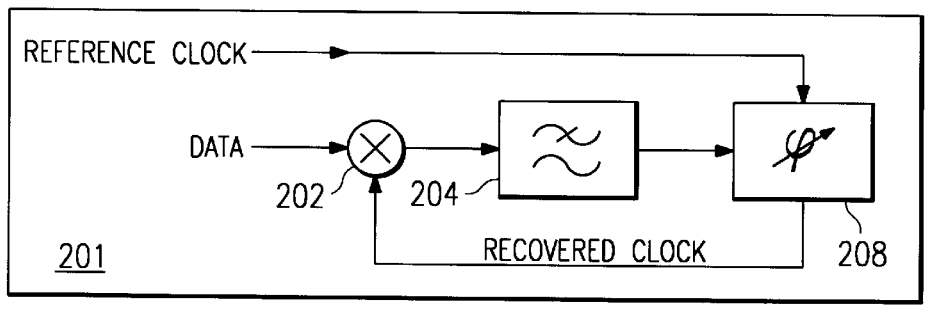

Referring to FIGS. 2 and 2a, a reference clock signal and data are input to clock recovery circuitry 201. Clock recovery circuitry 201 manipulates the reference clock signal so as to provide a "recovered clock," which is synchronized with the input data. The recovered clock is used to clock retimer 200 (preferably a flip-flop or a DMUX) so as to receive data.

In general, clock recovery circuitry of the present invention may comprise a filter (such as filter 204) and a phase-rotator (such as phase-rotator 208). In addition, clock recovery circuitry 201 may also comprise a phase detector (such as phase detector 202). Note that the reference clock of clock recovery circuitry 201 is "open loop," whereas the recovered clock operates within a "closed loop," which includes phase detector 202, filter 204 and phase-rotator 208.

Figure 4A:
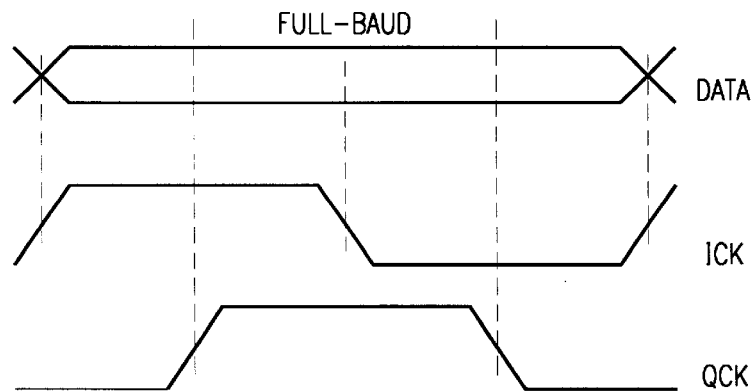
FIGS. 4a and 4b are timing diagrams illustrating full-baud and half-baud data flow, respectively.
Figure 4B:
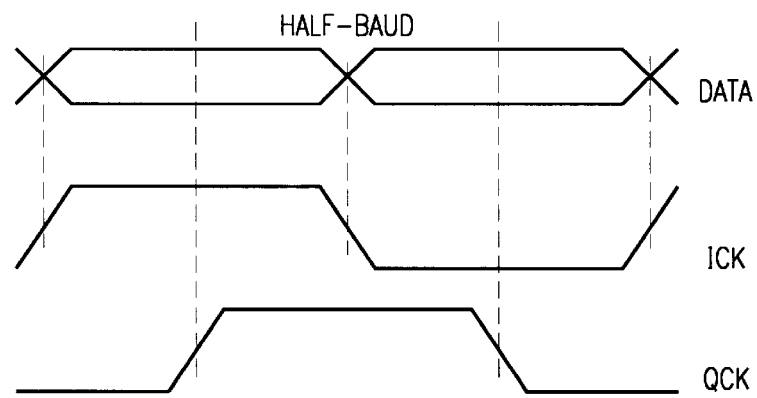

Referring to FIGS. 4a and 4b, the present invention can be applied to a full-baud clock as well as a half-baud clock. In FIGS. 4a and 4b, QCK refers to the quadrature of clocking signal, ICK. The full-baud clock (see ICK of FIG. 4a) has one edge aligned with the data transitions (see first dotted line of FIG. 4a), the other edge (see third dotted line of FIG. 4a) is the ideal strobe edge. The half-baud clock (see ICK of FIG. 4b) has both edges aligned with the data transitions so that both edges of a quadrature clock are the ideal strobe edges.

In the following embodiments of the instant invention, like reference numerals are used in several of the figures to indicate like or similar circuit elements.

Figure 5:
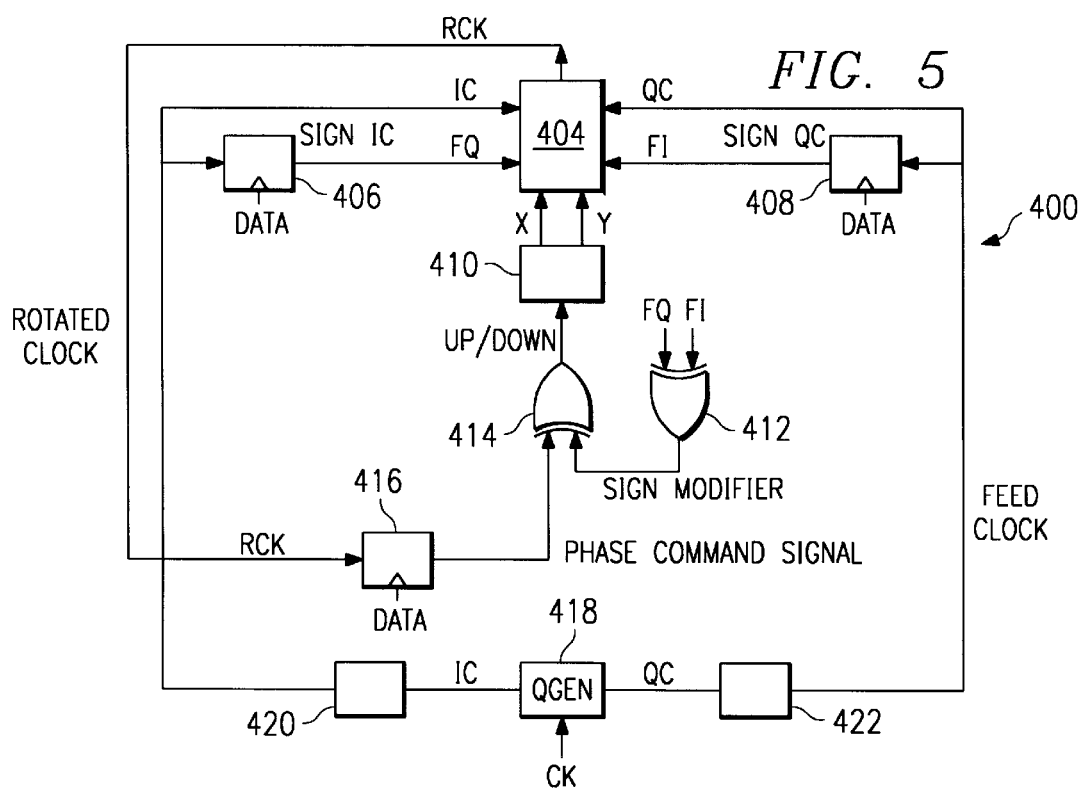
FIG. 5 is a block diagram illustrating an embodiment of an analog clock synchronizer.

FIG. 5 is a block diagram of one embodiment of the present invention, analog clock synchronizer 400. Analog clock synchronizer 400 includes phase-rotator 404, which has six inputs (FQ, FI, QC, IC, and the outputs of filter 410, X and Y). In addition phase-rotator 404 has an output, RCK, which is connected to the input of detector 416 (which may implemented by some type of phase detector). The RCK signal of this figure is basically the same as the RICK signal of the subsequent figures. Phase detector 416 is clocked by the input data stream and provides the PHASE COMMAND signal to XOR gate 414.

Quadrature generator 418 receives a clock signal, CK, as an input and generates a quadrature signal pair, IC and QC. The FQ input of phase-rotator 404 is the output of quadrant detector 406, which is clocked by the input data. The FQ signal is also referred to as the "sign IC" signal because it is the sampled sign of the IC clock. The IC output of quadrature generator 418 is passed through filter 420 and this provides the IC input to quadrant detector 406 and the IC input to phase-rotator 404. The FI input of phase-rotator 404 is the output of quadrant detector 408. Similar to the FQ input of phase-rotator 404, the FI signal is referred to as the "sign QC" signal because it is the sampled sign of the QC signal. Hence, it is possible to determine the quadrant of the phasor purely from the FI and FQ signals. The QC output of quadrature generator 418 is passed through filter 422 to provide the input to quadrant detector 408 and the QC input to phase-rotator 404. The input of quadrant detector 408, which is clocked by the input data stream, is the QC signal. Similarly, the input of quadrant detector 406, which is also clocked by the input data stream, is the IC signal. Quadrant detectors 406 and 408 can be implemented by phase detectors. Details of one type of phase detectors may be found in a co-pending patent application Ser. No. 08/146,680 (TI-17655), assigned to Texas Instruments Incorporated.

Analog filter is simply an integrator or a low pass filter driven by the signal, UP/DOWN. Filter 410 provides the X and Y inputs to phase-rotator 404. The input of filter 410 is the UP/DOWN signal which is the XOR product of the PHASE COMMAND signal (which is the output of phase detector 416) and the SIGN MODIFIER signal. The SIGN MODIFIER signal is the XOR product, via XOR gate 412, of the FI and FQ signals.

The SIGN MODIFIER signal modifies the sign of the PHASE COMMAND SIGNAL. The sign of the raw phase detector command signal, PHASE COMMAND SIGNAL, depends on the quadrant and so the quadrant pointer bits, FI and FQ, are decoded to provide a sign bit, SIGN MODIFIER; this maps the linear integrator output, corresponding to one quadrant, onto the phasor diagram, corresponding to four quadrants.

The quadrant bits, FI and FQ, should preferably be derived in an open-loop manner by sampling the feed clocks, IC and QC. These extra phase detectors are called the quadrant detectors (quadrant detectors 406 and 408).

In systems where delays are not negligible, phase detector 416 should preferably be of the same type as quadrant detectors 406 and 408, so that there is no disagreement between the phase detector and the quadrant detectors. Furthermore, in systems where the delay through the rotator is not negligible, the feed clock delay through phase-rotator 404 should preferably be matched before the quadrant sampling is done. This is done to avoid discrepancies between the phase detector and the quadrant detectors.

In the subsequent figures the integrator output (the output of filter 410) will be shown as a single value, "a". Signal "a" should preferably be converted into the weighting factors X and Y by circuitry included within the phase-rotator. This circuitry may preferably be an Emitter-Coupled Pair.

The output of analog clock synchronizer 400 is a clock which is synchronized to this data stream.

Figure 6:
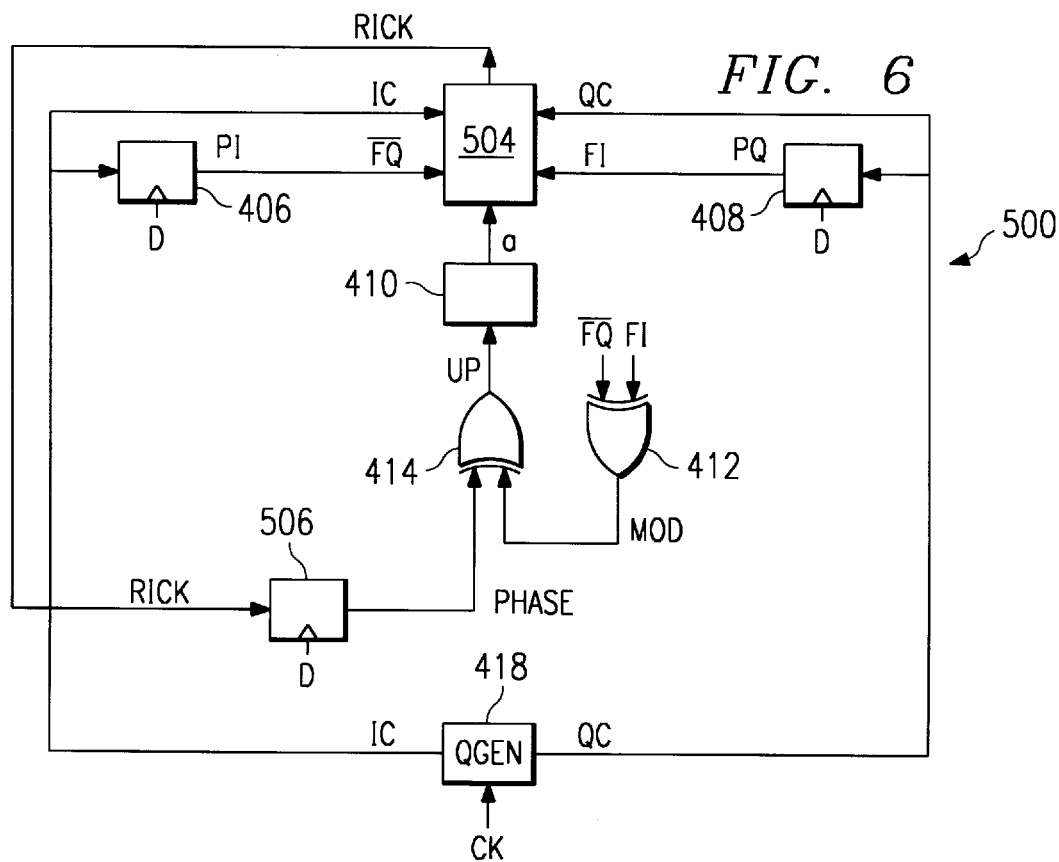
FIG. 6 is a block diagram illustrating an embodiment of the present invention. This embodiment is a full-baud clock synchronizer.

FIG. 6 is an illustration of another embodiment of the present invention. Full-baud analog clock synchronizer 500 includes phase rotator 504, which is similar to phase-rotator 404 of FIG. 5, except that phase-rotator 504 includes circuitry to convert "a" into weighting factors X and Y. Phase-rotator 504 has five inputs, $\overline{FQ}$, FI, IC, QC and the output of filter 410, "a", and an output, RICK The RICK output of phase-rotator 504 is connected to the input of phase detector 506 (which may be implemented by a phase sampler circuit). Phase detector 506, quadrant detector 406 and quadrant detector 408 are all clocked by the input data stream. The output of phase detector 506, PHASE, is connected to one of the inputs of XOR gate 414, and the other input of XOR gate 414 is connected to the output of XOR gate 412. The output of XOR gate 412, MOD, is the XOR product of $\overline{FQ}$ and FI.

The FI input of phase-rotator 504 is connected to the output of quadrant detector 408, which has its input connected to the QC output of quadrature generator 418. In addition, the QC input of phase-rotator 504 is connected to the QC output of quadrature generator 418. The $\overline{FQ}$ input of phase-rotator 504 is connected to the output of quadrant detector 406, which has its input connected to the IC output of quadrature generator 418. Additionally, the IC output of quadrature generator 418 is connected to the IC input of phase-rotator 504.

Figure 6A:
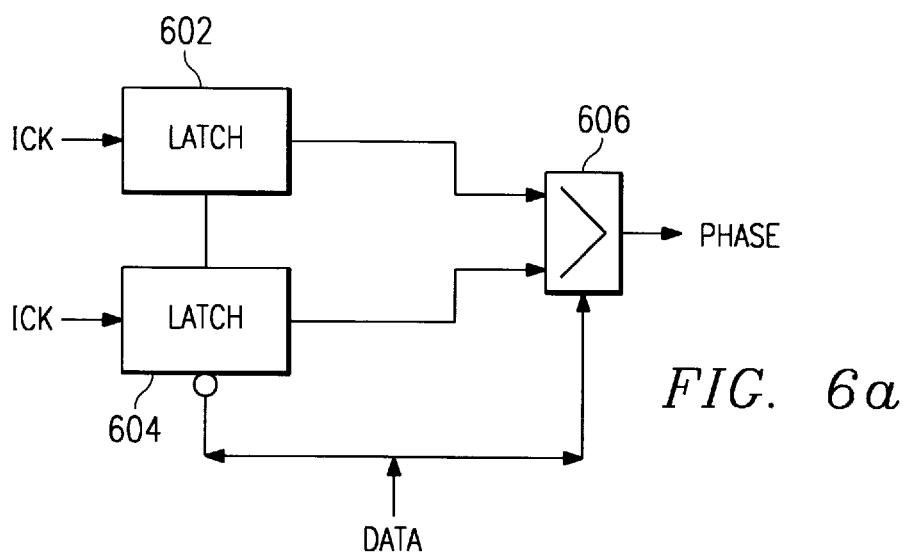
FIG. 6a is a block diagram of a full-baud phase sampler.

Referring to FIG. 6a, phase detector 506 and quadrant detectors 406 and 408 can be implemented by phase samplers. The phase sampler may comprise a pair of latches (latches 602 and 604) and a MUX (MUX 606). Latches 602 and 604 are clocked by the input data. One latch captures the value of the clock on the rising edge, and one captures the value of the clock on the falling edge. MUX 606, also driven by the data, presents the valid (or latched) value as the phase information. The phase information may be limited to the sign (positive or negative). However, in very high speed environments, the latch can be made to act as a sample and hold and then some sort of finite gain can be achieved. In the case in which only the sign is available, the control becomes bang-bang, or best-effort; this is a valid control mechanism.

Figure 7:
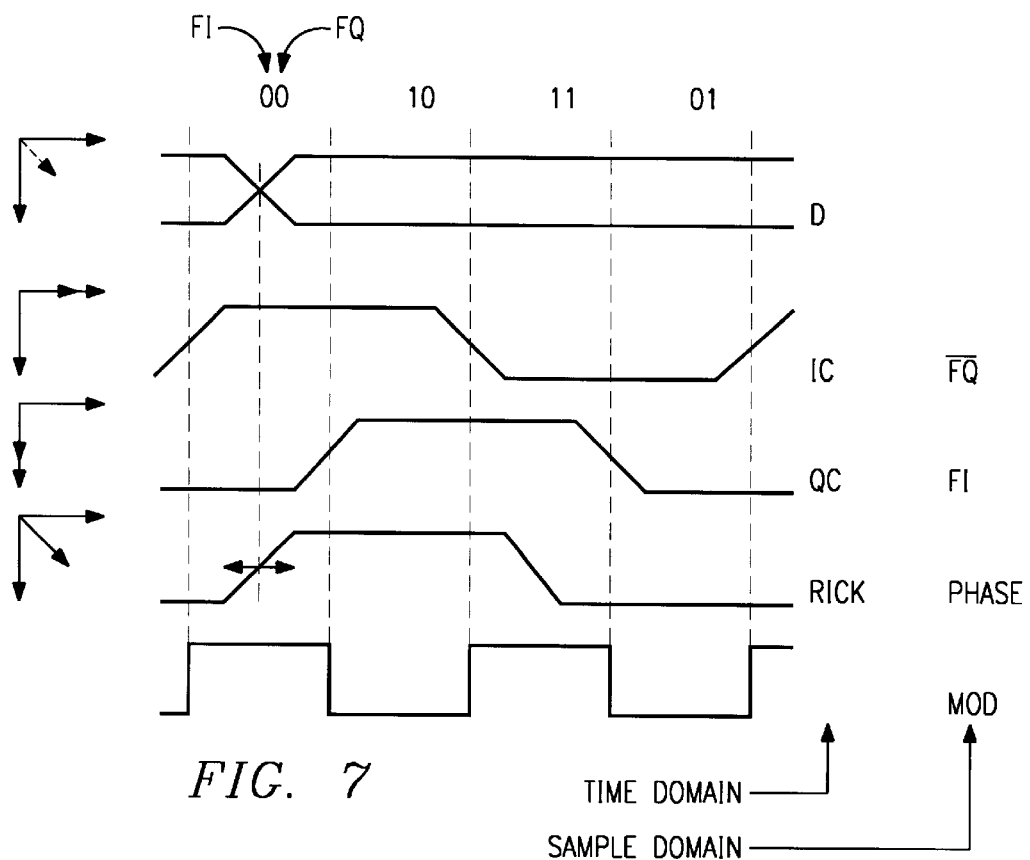
FIG. 7 is a timing diagram illustrating the operation of analog clock synchronizers of FIGS. 5 and 6.

Referring to the operation of full-baud analog clock synchronizer of FIG. 6 in conjunction with the timing (phasor diagram of FIG. 7. The rotated I clock, RICK, is shown as equal in phase to the data stream, D, and their phasor representations are represented to the left of the timing representations in FIG. 7. The data phasor is dotted because a transition is not guaranteed. Feed clocks, IC and QC, are utilized as the reference. The data stream, D, and hence RICK under loop control, can drift relative to the reference clocks, IC and QC. Feed clocks, IC and QC, are sampled at each data transitions. Because the quadrant information is directly available from the feed clocks through the sampling process, sample domain relations are realized, and these samples of IC and QC, then, make up the quadrant pointers, FI and $\overline{FQ}$. An example state assignment is shown by the senses of FI and FQ and by the numbers above the waveforms in FIG. 7, which are ordered pairs (FL, FQ). The quadrant sign bit, MOD, is computed from the pointer bits, FI and FQ, by XOR.

Figure 7A:
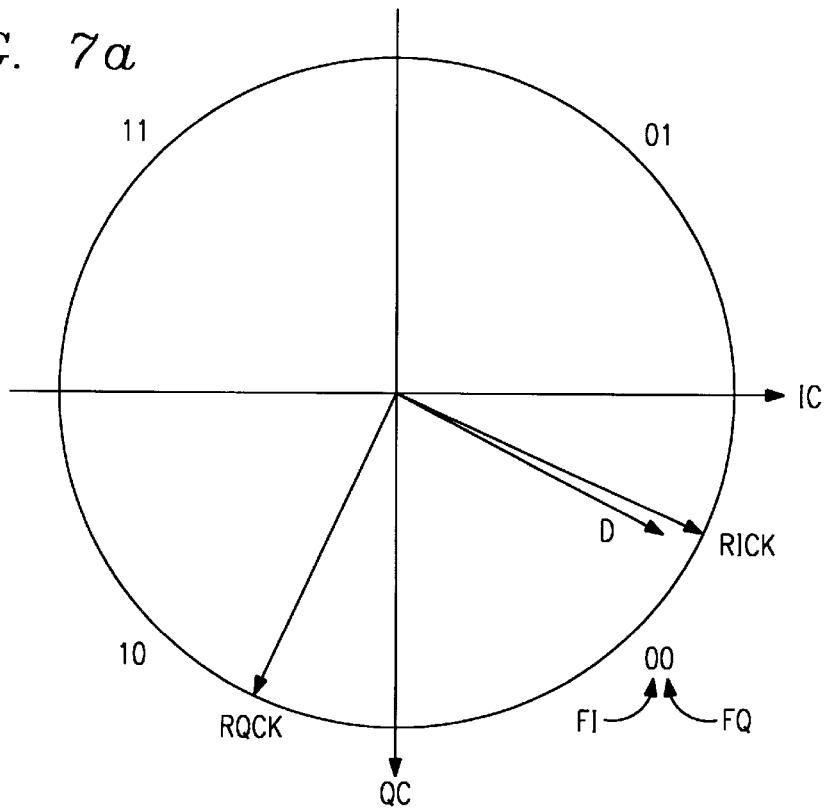
FIG. 7a is a phasor diagram illustrating the operation of the analog clock synchronizers of FIGS. 5 and 6.

FIG. 7a is a phasor diagram of the operation of the full-baud analog clock synchronizer of FIG. 6. FIG. 7a illustrates the signals depicted in FIG. 7 in phasor form.

Figure 8:
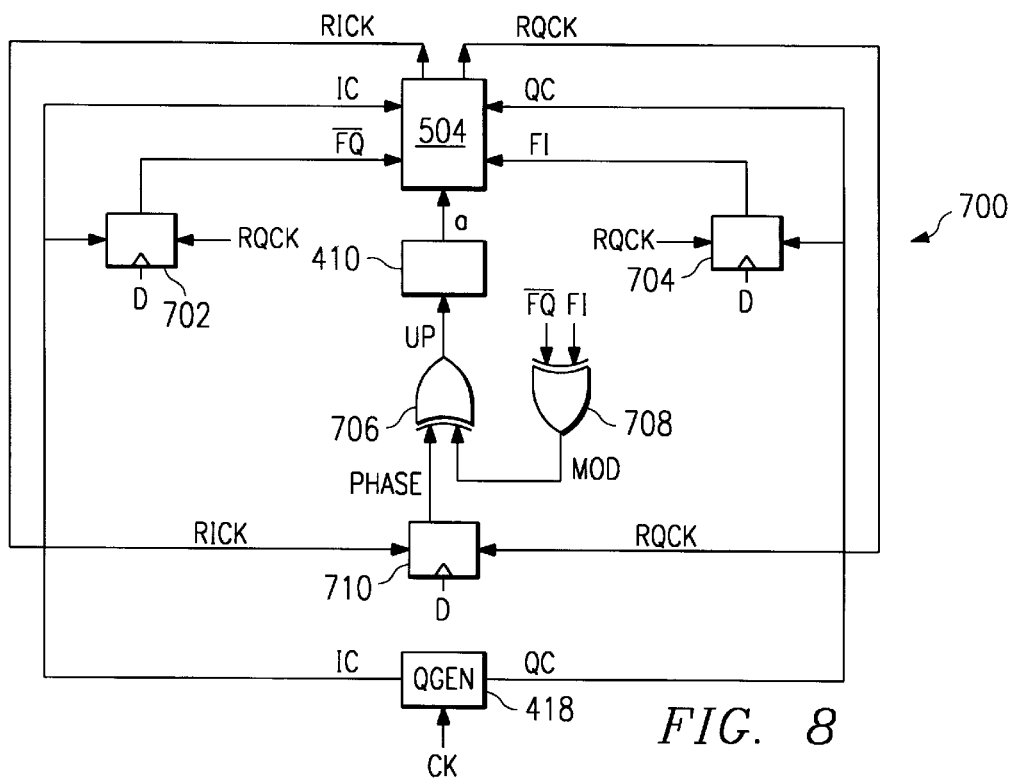
FIG. 8 is a block diagram illustrating an embodiment of a half baud analog clock synchronizer.
Figure 9:
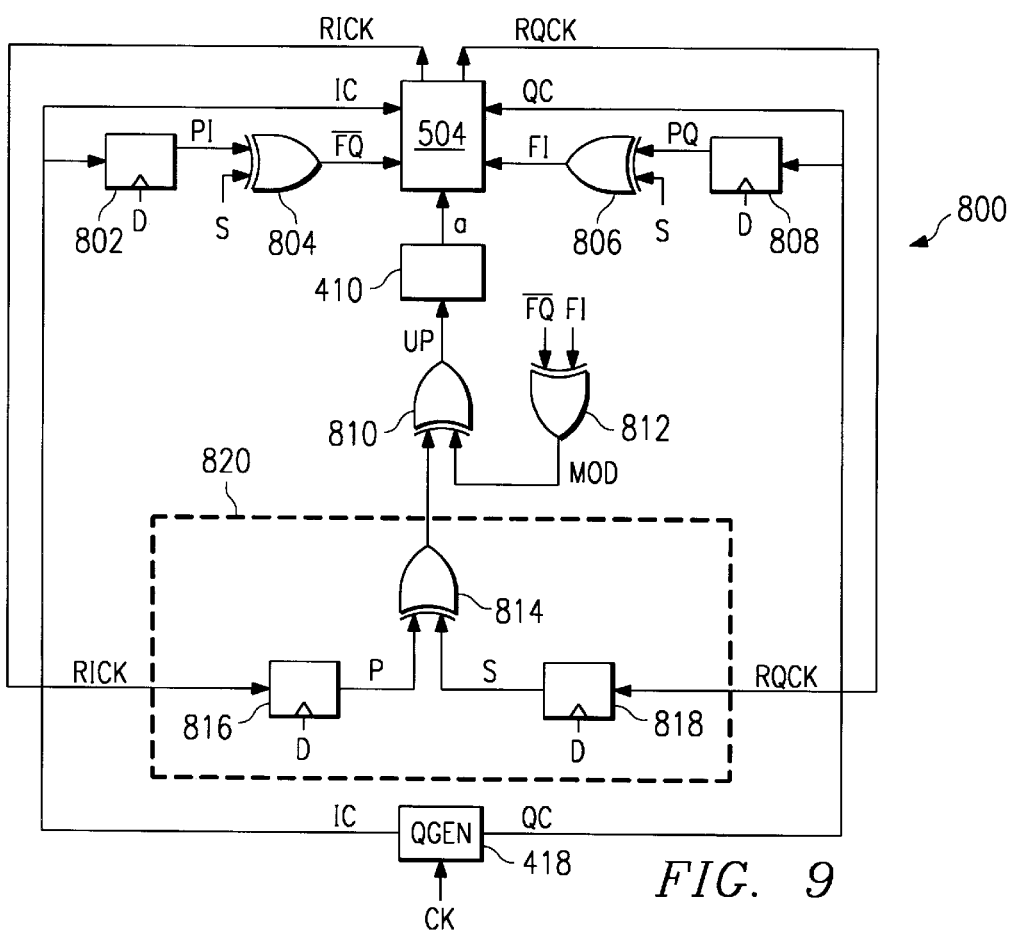
FIG. 9 is a block diagram illustrating an embodiment of the present invention. This embodiment is a half-baud clock synchronizer.

FIGS. 8 and 9 illustrate other embodiments of the present invention. The embodiments of FIGS. 8 and 9 are half-baud realizations. Referring to FIG. 8, phase-rotator 504 receives IC, $\overline{FQ}$, a, FI and QC inputs and outputs the RICK and RQCK signals. The RQCK signal is an input to quadrant detectors 702 and 704 and phase detector 710, and each is clocked by the data stream.

Figure 10:
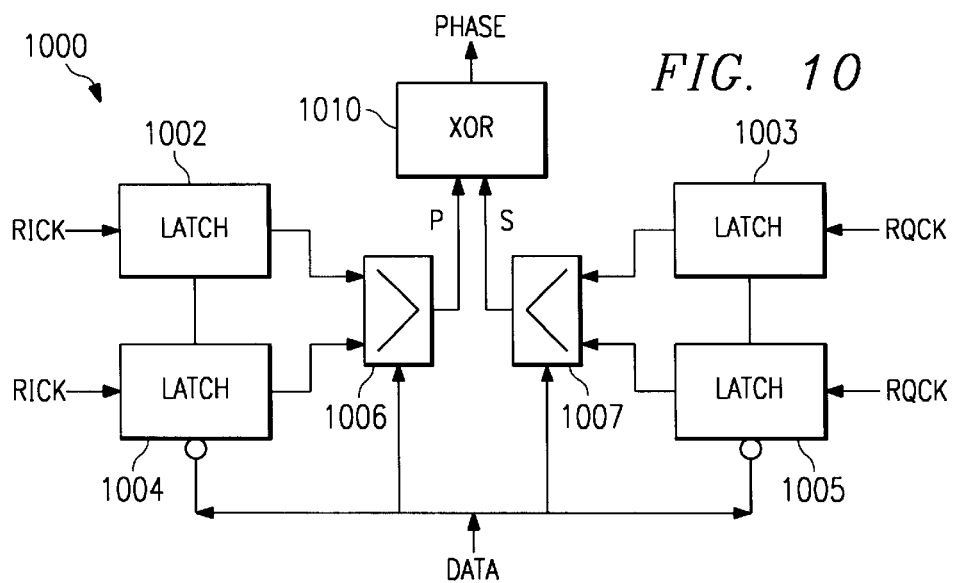
FIG. 10 is a block diagram of a half-baud phase detector.

The system FIG. 8, can align a half-baud clock to the data because the rotated clock is split into a quadrature pair, RICK and RQCK (rotated Q-clock, QC), and the phase detector of FIG. 10 is utilized for quadrant detectors 702 and 704 and phase detector 710. Referring momentarily to FIG. 10, phase detector 1000 comprises latches 1002, 1003, 1004 and 1005, MUXs 1006 and 1007, and XOR gate 1010. Quadrature clock, RQCK, is used as a marker to differentiate between the positive and negative edges of the main clock, RICK. The sample, S, of the quadrature clock becomes the sign of the sample, P, of the main clock. This sign bit divides the phasor diagram into a positive and negative semicircle (see FIG. 12, the shaded semicircle represents a positive or negative value and the unshaded semicircle represents the other). This method of assigning a sign to each phase semicircle should preferably be used on the samples of the feed clocks, IC and QC, in the process of creating FI and FQ.

This is achieved by sending the quadrature clock, RQCK to quadrant detectors 702 and 704.

Referring to FIG. 9, phase-rotator has five inputs, IC, $\overline{F}$ $\overline{Q}$, QC, FI and a, and has two outputs, RICK and RQCK. The IC input is also an input to phase sampler 802, which is clocked by the data stream. The output of quadrant detector 802, PI, is an input, along with the sample signal (S), to XOR gate 804. The product of XOR gate 804 is FQ. The QC input is also an input to phase sampler 808. The output of quadrant detector 808, PQ, and the sample signal, S, are the two inputs to XOR gate 806. The product of XOR gate 806 is FI.

The input to phase sampler 816 is the RICK output of phase-rotator 504 and the input to phase sampler 818 is the RQCK output. The outputs of phase samplers 816 and 818 (P and S, respectively) are the inputs to XOR gate 814. The inputs of XOR gate 812 are the FI and $\overline{FQ}$ signals. The XOR product of XOR gate 810, whose inputs are the outputs of XOR gates 812 and 814 (MOD and PHASE, respectively), is the UP signal. The UP signal provides the input to filter 410.

Since the same sign bit is used in all the phase detectors, some saving in logic and loading of RQCK can be made by reusing the S bit. More specifically, S is utilized as an input to XOR gate 804 in conjunction with the output of phase sampler 802, and S is also used as an input to XOR gate 806 in conjunction with the output of phase sampler 808.

In order to show where S is derived, phase detector 820 is shown in an expanded fashion. Phase detector is comprised of phase samplers 816 and 818 and XOR gate 814. The output of phase sampler 818 is the S signal. Phase samplers 816 and 818 are similar to the phase sampler of FIG. 6a.

Figure 11A:
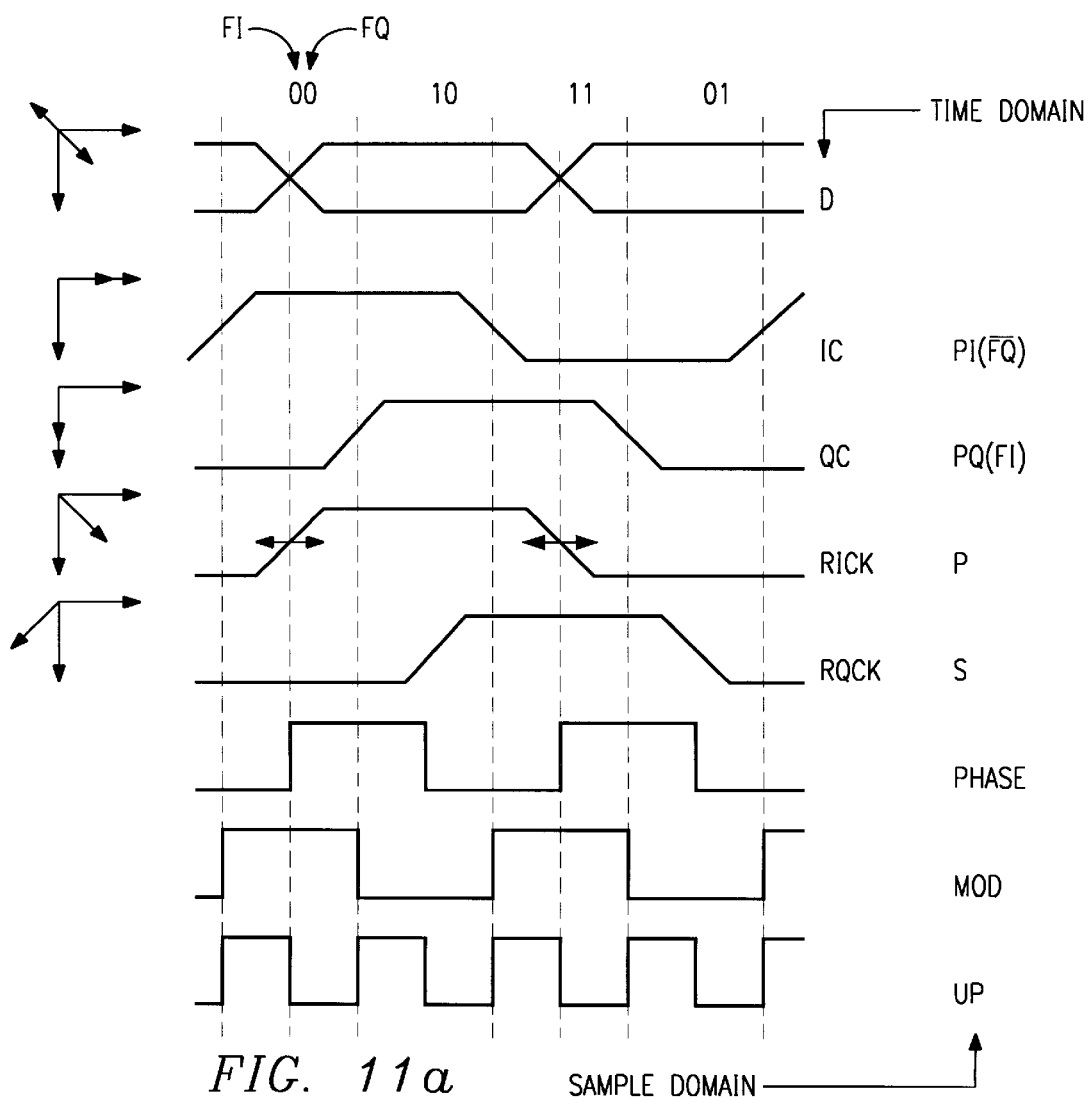
FIGS. 11a and 11b are timing diagrams illustrating the operation of half-baud clock synchronizers of FIGS. 8 and 9
Figure 11B:
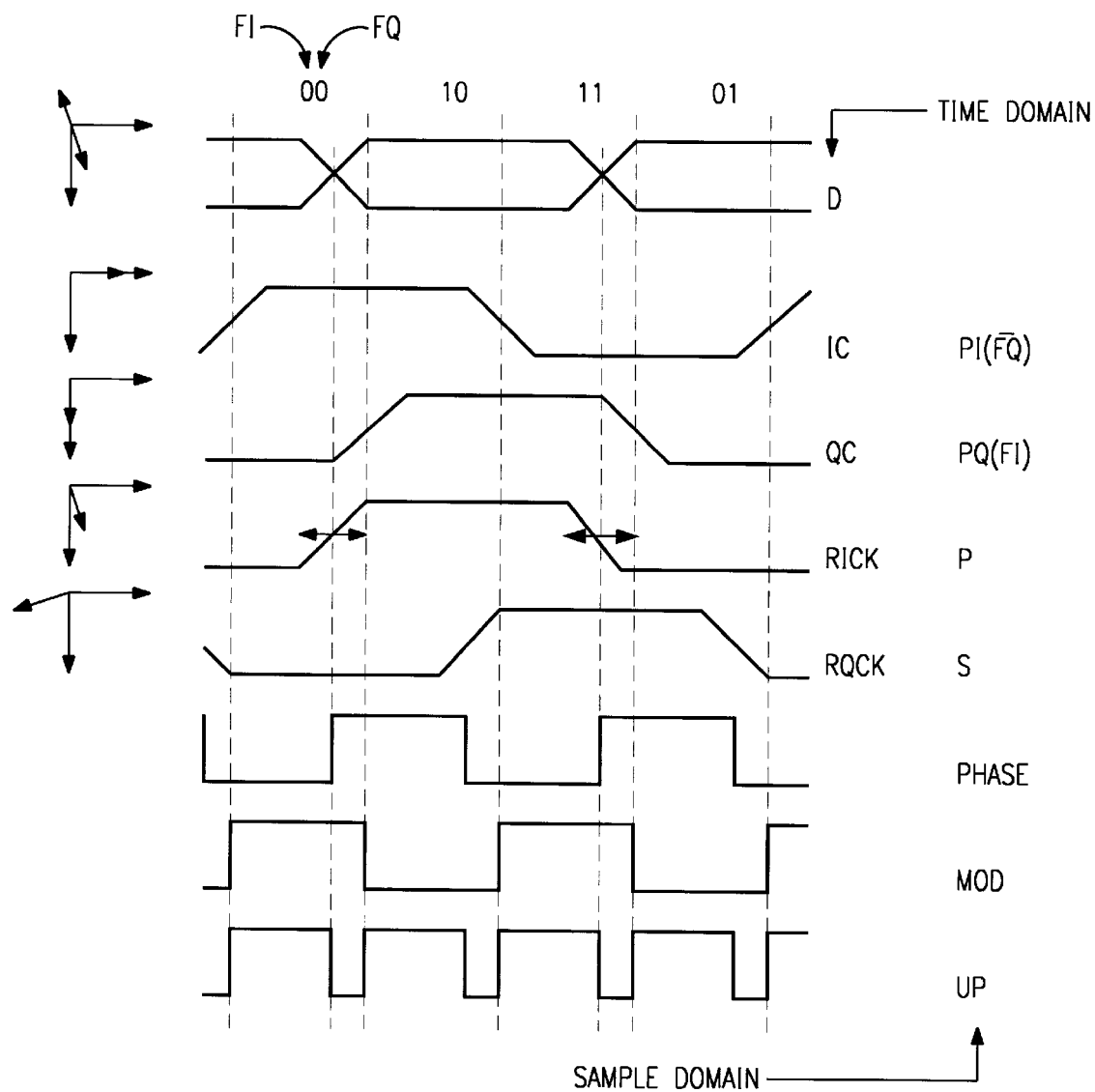

Referring to the operation of the half-baud analog clock synchronizers of FIGS. 8 and 9 in conjunction with FIGS. 11a and 11b, the operation of the half-baud analog clock synchronizers is like that of the full-baud version except that in the half-baud version the data stream can have transitions at either rising or falling edges of the clocks. Therefore, it is necessary to be able to distinguish between samples near one edge from those near another. The sample, S, of the rotated quadrature clock, RQCK, is used as a sign bit for all the other samples, PI, PQ, P. The result is FQ, FI, and PHASE.

Figure 11C:
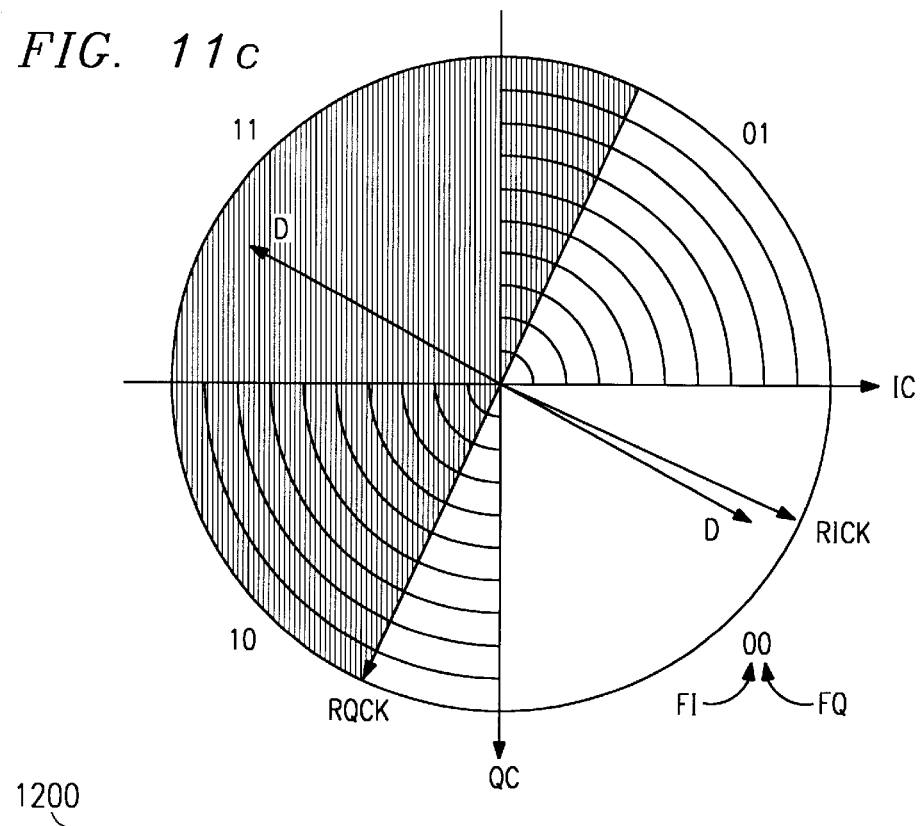
FIG. 11c is a diagram illustrating the operation of the half-baud analog clock synchronizers of FIGS. 8 and 9.

The phasor diagram representation of this is shown in FIG. 11c. FIG. 11c shows two possible data vectors, D, in one cycle. The cycle is divided into two semicircles by the rotated quadrature clock. Each semicircle is associated with a value of the semicircle sign parameter, S. Two quadrants are marked with lines to indicate quadrants with like quadrant sign parameter, MOD. For example, the shaded semicircle may represent $\overline{S}$ and the unshaded semicircle would then represent S. In addition, the 01 and 10 quadrants may represent MOD and quadrants 00 and 11 would then represent $\overline{MOD}$.

Figure 12:
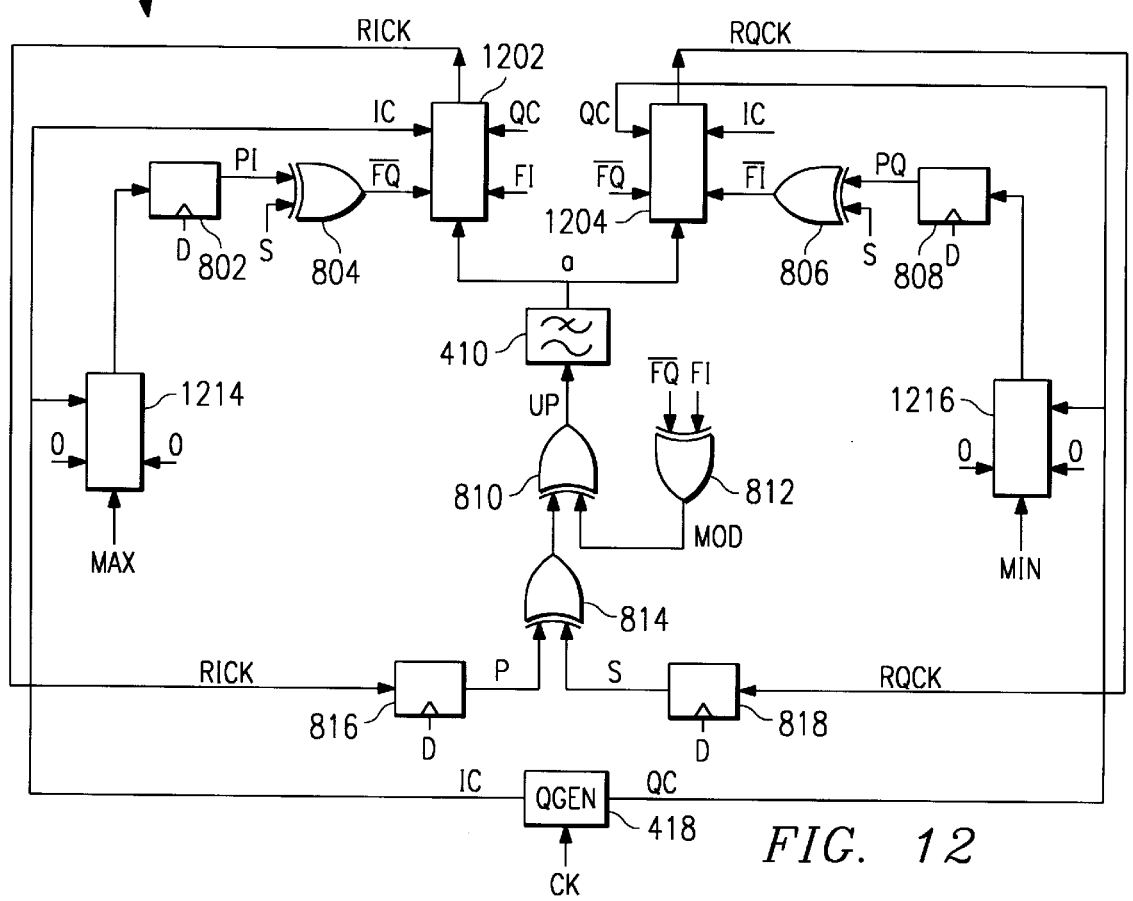
FIG. 12 is a block diagram illustrating another embodiment of a half baud analog clock synchronizer.

Referring to FIG. 12, in an embodiment of the half-baud system (1200), two rotators (phase rotators 1202 and 1204) are used to produce the main clock, RICK, and quadrature clock, RQCK, respectively. The quadrature of any vector may be created by switching the magnitude of basis vectors, I and Q, and changing one basis vector's sign. Hence, the same control signal and a rewired rotator can provide a quadrature clock.

In a practical high speed clock synchronizer, dummy rotators (phase-rotators 1214 and 1216) are used to delay the feed clocks in order to match them with the real basis vectors of the rotated clocks. This means that in total four rotators are used.

What is claimed is:

1. Electronic circuitry for producing a clock signal and changing the phase of the clock signal within one quadrant in response to a feed clock signal, a quadrature feed clock signal and input data, said circuitry comprising:

circuitry for providing an I-phase quadrant pointer;

circuitry for providing a Q-phase quadrant pointer;

a first logic gate for accepting said I-phase quadrant pointer and said Q-phase quadrant pointer and for producing a sign modifier signal;

circuitry for providing a phase command signal in response to receipt of said input data and said produced clock signal which has a phase which was changed within one quadrant in response to said feed clock and quadrature feed clock signals;

a second logic gate for accepting said phase command signal and said sign modifier signal and for producing an up/down signal, said up/down signal specifies the manner in which to change said phase of said produced clock signal; and wherein said electronic circuitry is operable to re-map the phase of one quadrant into that of any of the other three quadrants by means of decoding said I-phase quadrant pointer and said Q-phase quadrant pointer.

2. The circuitry of claim 1 wherein said first logic gate is an XOR gate.

3. The circuitry of claim 1 wherein said second logic gate is an XOR gate.

4. The circuitry of claim 1 wherein said circuitry for providing said phase command signal is a phase detector.

5. Electronic circuitry for producing a clock signal whose phase matches the phase of input data in response to receipt of said input data and a reference clock signal, said circuitry comprising:

circuitry for providing the quadrature of said reference clock signal;

circuitry for providing a Q-phase quadrant pointer in response to said input data and said reference clock signal;

circuitry for providing an I-phase quadrant pointer in response to said input data and said quadrature reference clock signal;

circuitry for providing a phase-change signal for specifying whether to rotate the phase of said produced clock signal in one direction or the other, said circuitry for providing said phase-change signal operable in response to said I-phase quadrant pointer, Q-phase quadrant pointer and said produced clock signal; and a phase rotator for changing the phase of said produced clock signal in response to said phase-change signal, said I-phase quadrant pointer, said Q-phase quadrant pointer, said reference clock, and said quadrature reference clock.

6. The circuitry of claim 5 wherein said circuitry for providing the quadrature reference clock signal is a quadrature generator.

7. The circuitry of claim 5 wherein said circuitry for providing said Q-phase quadrant pointer is a quadrant detector.

8. The circuitry of claim 7 wherein said quadrant detector comprises:

a first latch clocked by said input data and operable to receive said reference clock signal, said first latch operable to latch on the rising edge of the reference clock signal;

a second latch clocked by said input data and operable to receive said reference clock signal, and said second latch operable to latch on the falling edge of said reference clock signal; and a multiplexer clocked by said input data and connected to the output of said first and second latches, said multiplexer operable to selectively produce either the output of the first or second latch as valid phase information.

9. The circuitry of claim 5 wherein said circuitry for providing said I-phase quadrant pointer is a quadrant detector.

10. The circuitry of claim 9 wherein said quadrant detector comprises:

a first latch clocked by said input data and operable to receive said quadrature reference clock signal, said first latch operable to latch on the rising edge of the quadrature reference clock signal;

a second latch clocked by said input data and operable to receive said quadrature reference clock signal, and said second latch operable to latch on the falling edge of said quadrature reference clock signal; and a multiplexer clocked by said input data and connected to the output of said first and second latches, said multiplexer operable to selectively produce either the output of the first or second latch as valid phase information.

11. The circuitry of claim 5 wherein said circuitry for providing said phase-change signal comprises:

a phase detector for producing a phase command signal in response to said produced clock signal and said input data; and circuitry for producing said phase-change signal in response to receipt of said phase command signal, said I-phase quadrant signal and said Q-phase quadrant signal.

12. Electronic circuitry for producing a clock signal, and its quadrature, whose phase matches the phase of input data in response to receipt of said input data and a reference clock signal, said circuitry comprising:

circuitry for providing the quadrature of said reference clock signal;

circuitry for providing a Q-phase quadrant pointer in response to said input data, and said reference clock signal;

circuitry for providing an I-phase quadrant pointer in response to said input data, and said quadrature reference clock signal;

circuitry for providing a phase signal in response to said produced clock signal, said quadrature of said produced clock signal and said input data;

circuitry for providing a phase-change signal for specifying whether to rotate the phase of said produced clock signal in one direction or the other, said circuitry for providing said phase-change signal operable in response to said I-phase quadrant pointer, Q-phase quadrant pointer and said produced clock signal; and a phase rotator for changing the phase of said produced clock signal and said quadrature of said produced clock signal in response to said phase-change signal, said I-phase quadrature pointer, said Q-phase quadrant pointer, said reference clock signal, and said quadrature reference clock signal.

13. The circuitry of claim 12 wherein said circuitry for providing said Q-phase quadrant pointer is a quadrant detector, said quadrant detector is responsive to said reference clock signal, said input data and said quadrature of said produced clock signal.

14. The circuitry of claim 12 wherein said circuitry for providing said Q-phase quadrant pointer comprises a phase sampler and an XOR gate.

15. The circuitry of claim 12 wherein said circuitry for providing said I-phase quadrant pointer comprises a quadrant detector, said quadrant detector is responsive to said input data, said quadrature reference clock signal and said quadrature of said produced clock signal.

16. The circuitry of claim 12 wherein said circuitry for providing said I-phase quadrant pointer comprises a phase sampler and an XOR gate.

17. The circuitry of claim 12 wherein said circuitry for providing said phase signal is a phase detector.

18. The circuitry of claim 12 wherein said circuitry for providing said phase signal is comprised of:
   a first phase sampler for providing a first sample signal;
   a second phase sampler for providing a second sample signal; and
   a logic gate for producing said phase signal in response to receipt of said first and second sample signals.

* * * * *